United States Patent [19]

Nishimura

[11] Patent Number: 5,844,433
[45] Date of Patent: Dec. 1, 1998

[54] SAMPLE/HOLD CIRCUIT WITH CURRENT MIRROR CIRCUITS

[75] Inventor: Kouichi Nishimura, Tokyo, Japan

[73] Assignee: NEC Corporation, Tokyo, Japan

[21] Appl. No.: 859,230

[22] Filed: May 19, 1997

[30] Foreign Application Priority Data

May 17, 1996 [JP] Japan .................................. 8-148453

[51] Int. Cl.$^6$ ............................................ G11C 27/02
[52] U.S. Cl. ........................................ 327/94; 327/92
[58] Field of Search ................. 327/91, 92, 93, 327/94, 96; 341/122–124; 323/315, 316, 317

[56] References Cited

U.S. PATENT DOCUMENTS

| | | | |
|---|---|---|---|
| 5,036,219 | 7/1991 | Dingwall et al. | 327/92 |
| 5,243,235 | 9/1993 | Wakayama et al. | 327/92 |
| 5,289,278 | 2/1994 | Bird | 327/94 |
| 5,473,273 | 12/1995 | Werner, Jr. et al. | 327/94 |

FOREIGN PATENT DOCUMENTS 61-126695  6/1986  Japan .

OTHER PUBLICATIONS

Microelectronic Circuits, Adel S. Sedra et al., Third Edition, Differential and Multistage Amplifiers, pp. 1–14.

*Primary Examiner*—My-Trang Nu Ton
*Attorney, Agent, or Firm*—Sughrue, Mion, Zinn, Macpeak & Seas, PLLC

[57] ABSTRACT

In a sample/hold circuit, a current switch generates a constant current in response to a control signal. A first current mirror circuit receives the constant current to generate first and second currents, and a second current mirror circuit receives the first current to generate a third current. A voltage buffer receives an input voltage at an input terminal to generate an output voltage at an output terminal. The voltage buffer is activated by the second and third currents. A hold capacitor is connected to the output terminal.

11 Claims, 7 Drawing Sheets

SAMPLE/HOLD CIRCUIT WITH CURRENT MIRROR CIRCUITS

BACKGROUND OF THE INVENTION

1. Field Of The Invention

The present invention relates to a small size sample/hold circuit with a low power dissipation and a large input/output dynamic range.

2. Description Of The Related Art

Generally, in an analog/digital (A/D) converter or an analog memory in a liquid crystal display (LCD) driving circuit, a sample/hold circuit is broadly used.

A prior art sample/hold circuit is formed by a voltage buffer for receiving an input voltage to generate an output voltage, two current switches for activating the voltage buffer, and a hold capacitor charged by the output voltage (see JP-A-61-126695). This will be explained later in detail.

In the prior art sample/hold circuit, however, since two current switches are required, the circuit configuration is increased in size due to the complexity of levels of control signals for the current switches, and the power dissipation is increased. Particularly, in an LCD signal processing circuit where ten or more sample/hold circuits are required, the increased power dissipation makes it difficult to introduce such sample/hold circuits into a semiconductor chip in terms of heat resistance of a semiconductor package. Further, since the current switches are connected in series to the voltage buffer, the input/output dynamic range of the sample/bold circuit is reduced.

SUMMARY OF THE INVENTION

It is an object of the present invention to provide a small size sample/hold circuit with a low power dissipation and a large input/output dynamic range.

According to the present invention, in a sample/hold circuit, a current switch generates a constant current in response to a control signal. A first current mirror circuit receives the constant current to generate first and second currents, and a second current mirror circuit receives the first current to generate a third current. A voltage buffer receives an input voltage at an input terminal to generate an output voltage at an output terminal. The voltage buffer is activated by the second and third currents. A hold capacitor is connected to the output terminal.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art sample/hold circuit will be explained with reference to FIG. 1 (see JP-A-8-148453).

Figure 1:
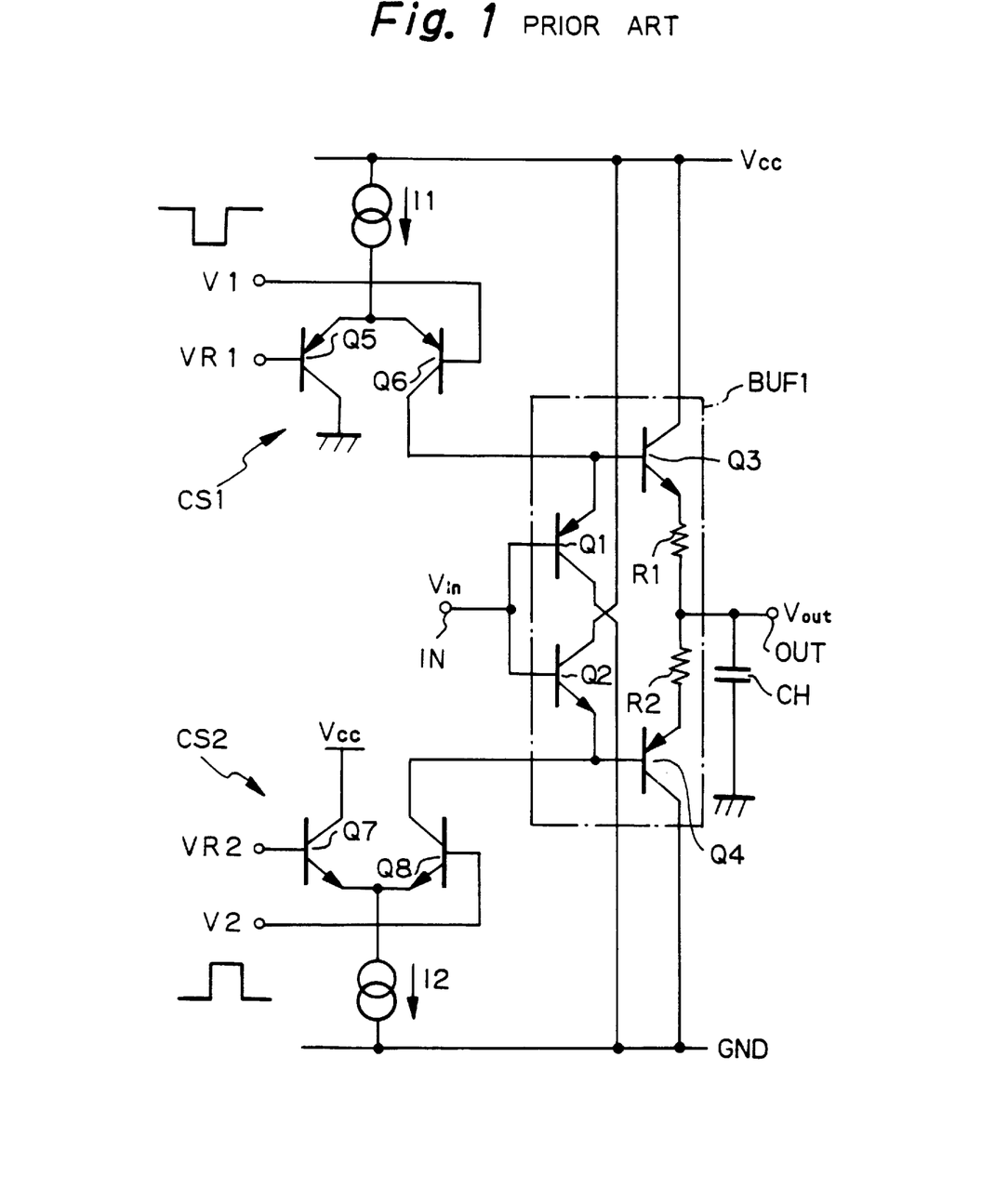
FIG. 1 is a circuit diagram illustrating a prior art sample/hold circuit.

In FIG. 1, BUF1 designates a voltage buffer for converting an input voltage $v_{in}$ at an input terminal IN into an output voltage $V_{out}$ at an output terminal OUT. The voltage buffer BUF1 is controlled by two current switches CS1 and CS2, and the output voltage $V_{out}$ is stored in a hold capacitor CH.

The voltage buffer BUF1 includes a PNP type transistor Q1 connected between the current switch CS1 and a ground terminal GND, and an NPN type transistor Q2 connected between the current switch CS2 and a power supply terminal $V_{CC}$. The transistors Q1 and Q2 are controlled by the input voltage $V_{in}$. Also, the voltage buffer BUF1 includes an NPN type transistor Q3 and a resistor R1 connected between the power supply terminal $V_{CC}$ and the output terminal OUT. The transistor Q3 is controlled by the current switch CS1. Further, the voltage buffer BUF1 includes a PNP type transistor Q4 and a resistor R2 connected between the ground terminal GND and the output terminal OUT. The transistor Q4 is controlled by the current switch CS2.

The current switch CS1 is formed by two PNP type transistors Q5 and Q6 having emitters commonly connected to a constant current source I1. In this case, a reference voltage VR1 is applied to the base of the transistor Q5, and a control voltage V1 is applied to the base of the transistor Q6. Similarly, the current switch CS2 is formed by two NPN type transistors Q7 and Q8 having emitters commonly connected to a constant current source I2. In this case, a reference voltage VR2 is applied to the base of the transistor Q7, and a control voltage V2 is applied to the base of the transistor Q8.

The sampling operation of the sample/hold circuit of FIG. 1 is explained below. In this case, the control voltage V1 is node low so that V1<VR1, and simultaneously, the control voltage V2 is made high so that v2>VR2. As a result, the transistor Q1 is biased by the current source I1 so that the transistor Q1 is turned ON. Simultaneously, the transistor Q2 is biased by the current source I2 so that the transistor Q2 is turned ON.

Also, the base of the transistor Q3 is biased by the transistor Q1 so that the transistor Q3 is turned ON. Simultaneously, the base of the transistor Q4 is biased by the transistor Q2 so that the transistor Q4 is turned ON.

Since the transistors Q1 and Q3 are turned ON, the following formula is satisfied:

$$V_{out}=V_{in}+V_{BE}(Q1)-V_{BE}(Q3)-I_E(Q3)\cdot R1 \qquad (1)$$

where $V_{BE}(Q1)$ is a base-emitter voltage of the transistor Q1;

$V_{BE}(Q3)$ is a base-emitter voltage of the transistor Q3; and $I_E(Q3)$ is an emitter current of the transistor Q3.

Similarly, since the transistors Q2 and Q4 are turned ON, the following formula is satisfied:

$$V_{out}=V_{in}-V_{BE}(Q2)+V_{BE}(Q4)+I_E(Q4)\cdot R2 \qquad (2)$$

where $V_{BE}(Q2)$ is a base-emitter voltage of the transistor Q2;

$V_{BE}(Q4)$ is a base-emitter voltage of the transistor Q4; and $I_E(Q4)$ is an emitter current of the transistor Q4.

Also, the values of the resistors R1 and R2 are very large, i.e., on an order of tens or hundreds of, $$V_{BE}(Q3) \gg I_E(Q3) \cdot R_1 \qquad (3)$$

$$V_{BE}(Q4) \gg I_E(Q3) \cdot R_2 \qquad (4)$$

Further, $$V_{BE}(Q1) \approx V_{BE}(Q3) \qquad (5)$$

$$V_{BE}(Q2) \approx V_{BE}(Q4) \qquad (6)$$

From the formulae (1), (2), (3), (4), (5) and (6)

$$V_{out} \approx V_{in} \qquad (7)$$

Thus, the hold capacitor CH is charged by the output voltage $V_{out}$ close to the input voltage $V_{in}$.

Next, the holding operation of the sample/hold circuit of FIG. 1 is explained below. In this case, the control voltage V1 is made high so that V1>VR1, and simultaneously, the control voltage V2 is made low so that V2<VR2. As a result, the transistor Q1 is not biased by the current source I1 so that the transistor Q1 is turned OFF. Simultaneously, the transistor Q2 is not biased by the current source I2 so that the transistor Q2 is turned OFF.

Also, the base of the transistor Q3 is not biased by the transistor Q1 so that the transistor Q3 is turned OFF. Simultaneously, the base of the transistor Q4 is not biased by the transistor Q2 so that the transistor Q4 is turned OFF.

Thus, the output terminal OUT is electrically isolated from the input terminal IN, so that the sampled input voltage $V_{in}$ is stored in the hold capacitor CH.

In the sample/hold circuit of FIG. 1, however, since two current switches CS1 and CS2 are required, the circuit configuration is increased in size due to the complexity of levels of the control voltages V1 and V2, and the power dissipation is increased. Particularly, in an LCD signal processing circuit where ten or more sample/hold circuits are required, the increased power dissipation makes it difficult to introduce such sample/hold circuits into a semiconductor chip in terms of heat resistance of a semiconductor package. Further, since the current switch CS1 is connected in series to the emitter of the transistor Q1, and the current switch CS2 is connected in series to the transistor Q2, the input/output dynamic range of the voltage buffer BUF1, i.e., the input/output dynamic range of the sample/hold circuit of FIG. 1 is reduced by the current switches CS1 and CS2. For example, if each of the current switches CS1 and CS2 reguires about 1 V, the input/output dynamic range is reduced by about 2 V.

Figure 2:
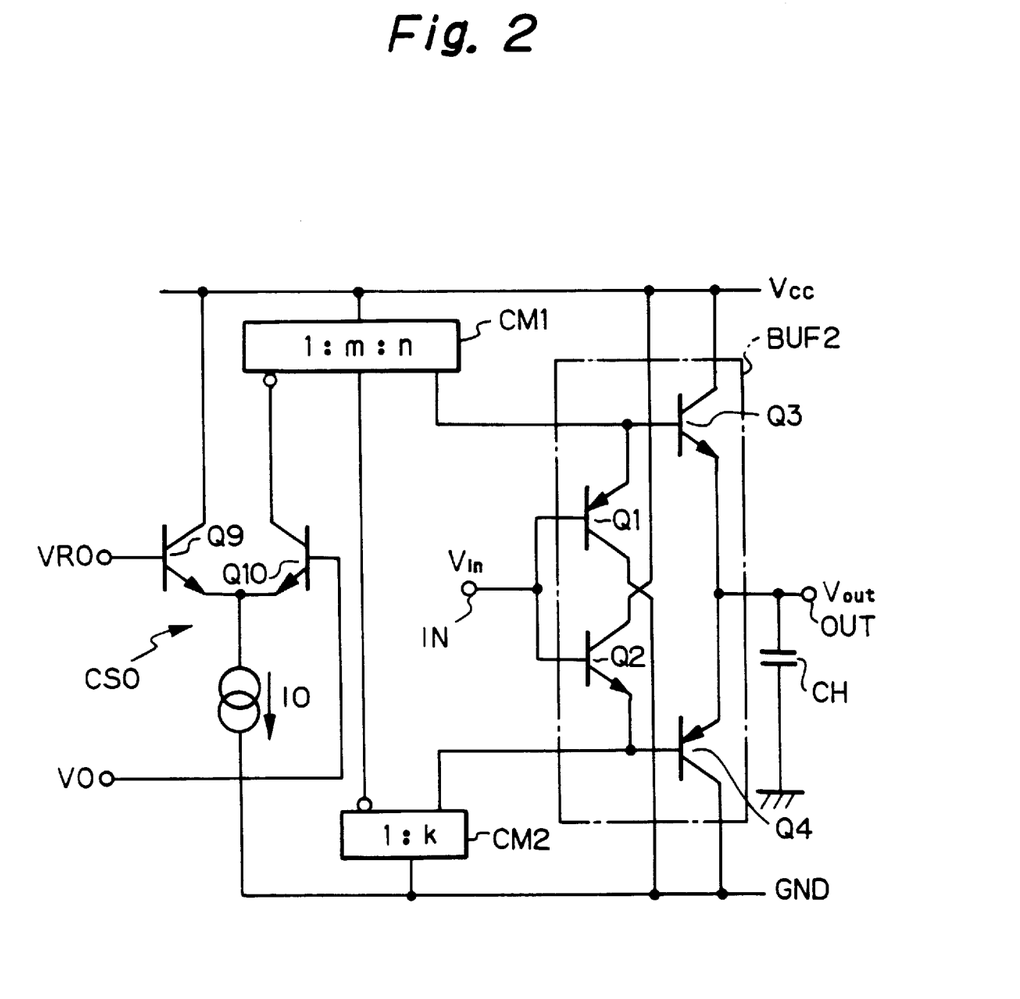
FIG. 2 is a circuit diagram illustrating a first embodiment of the sample/hold circuit according to the present invention.

In FIG. 2, which illustrates a first embodiment of the present invention, a voltage buffer BUF2 is provided instead of the voltage buffer BUF1 of FIG. 1. In the voltage buffer BUF2, the resistors R1 and R2 of the voltage buffer BUF1 of FIG. I are not provided.

Also, in FIG. 2, a current switch CS0 and current mirror circuits CM1 and CM2 are provided instead of the current switches CS1 and CS2. That is, although the current mirror circuits CM1 and CM2 are added to the elements of FIG. 1, the number of current switches is reduced from 2 to 1, which can simplify the circuit configuration and reduce the power dissipation.

The current switch CS0 is formed by two NPN type transistors Q9 and Q10 having emitters commonly connected to a constant current source $I_o$. In this case, a reference voltage VR0 is applied to the base of the transistor Q9, and a control voltage V0 is applied to the base of the transistor Q10.

The current mirror circuits CM1 and CM2 are controlled by the current switch CS0. When the current mirror circuit CM1 is turned ON by the current switch CS0, the current mirror circuit CM1 supplies a current of I0×m to the current mirror circuit CM2, and also, the current mirror circuit CM1 supplies a current of I0×n to the voltage buffer BUF2. On the other hand, when the current mirror circuit CM2 is turned ON by the current switch CS0, the current mirror circuit CM2 draws a current of I0×m ×k from the voltage buffer BUF2.

Figure 3A:
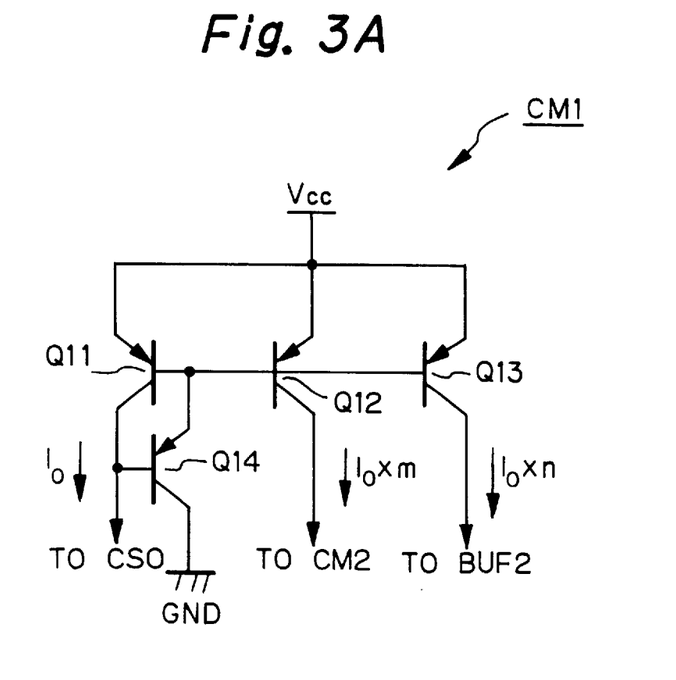
FIGS. 3A, 3B, 4A and 4B are circuit diagrams of the current mirror circuits of FIG. 2.

The current mirror circuit CM1 is illustrated in FIG. 3A. That is, the current mirror circuit CM1 is formed by three PNP type transistors Q11, Q12 and Q13 having a common emitter connected to the power supply terminal $V_{CC}$ and a common base. In this case, the collectors of the transistors Q11, Q12 and Q13 are connected to the current switch CS0, the current mirror circuit CM2 and the voltage buffer BUF2, respectively. Also, a PNP type transistor Q14 is provided between the common base of the transistors Q11, Q12 and Q13 and the ground terminal GND. The base of the transistor Q14 is connected to the collector of the transistor Q11. Note that the emitter area of the transistor Q12 is m times that of the transistor Q11, and the emitter area of the transistor Q13 is n times that of the transistor Q11. Thus, the ratio of collector currents flowing through the transistors Q11, Q12 and Q13 is 1:m:n.

Figure 3B:
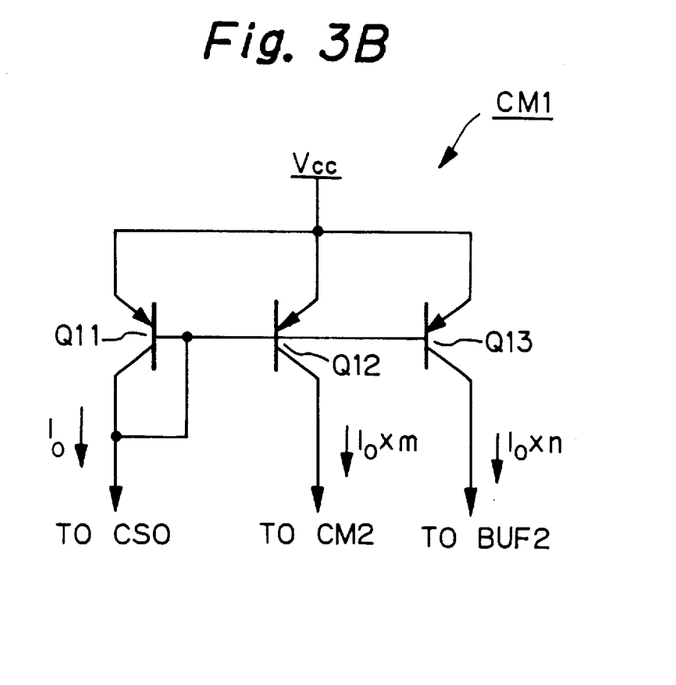

Also, as illustrated in FIG. 3B, the transistor Q14 of FIG. 3A can be deleted; in this case, the collector of the transistor Q11 is connected to the common base of the transistors Q11, Q12 and Q13.

Further, in FIGS. 3A and 3B, the emitter areas of the transistors Q11, Q12 and Q13 can be equal to each other; in this case, resistors are inserted into the emitters of the transistors Q11, Q12 and Q13 to adjust the collector currents flowing through the transistors Q11, Q12 and Q13.

Figure 4A:
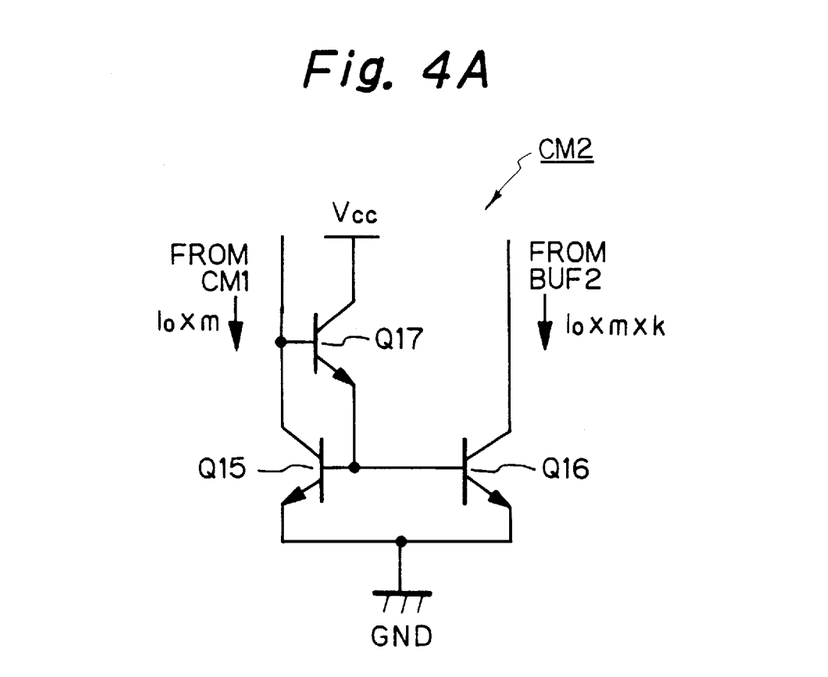

The current mirror circuit CM2 is illustrated in FIG. 4A. That is, the current mirror circuit CM2 is formed by two NPN type transistors Q15 and Q16 having a common emitter connected to the ground terminal GND and a common base. In this case, the collectors of the transistors Q15 and Q16 are connected to the current mirror circuit CM1 and the voltage buffer BUF2, respectively. Also, an NPN type transistor Q17 is provided between the common base of the transistors Q15 and Q16 and the power supply terminal $V_{CC}$. The base of the transistor Q17 is connected to the collector of the transistor Q15. Note that the emitter area of the transistor Q16 is k times that of the transistor Q15. Thus, the ratio of collector currents flowing through the transistors Q15 and Q16 is 1:k.

Figure 4B:
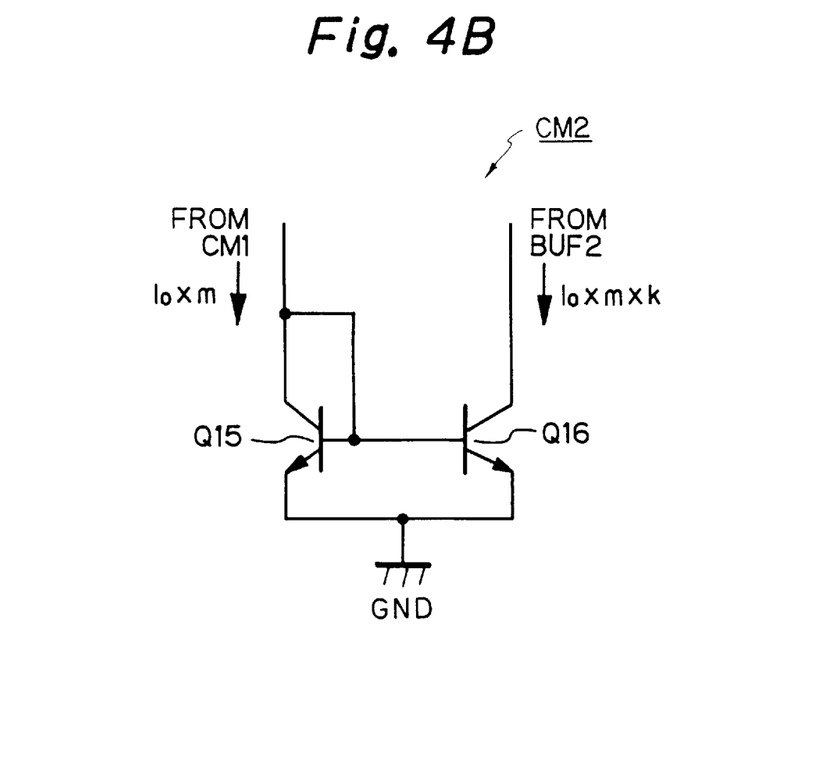

Also, as illustrated in FIG. 4B, the transistor Q17 of FIG. 4A can be deleted; in this case, the collector of the transistor Q15 is connected to the common base of the transistors Q15 and Q16.

Further, in FIGS. 4A and 4B, the emitter areas of the transistors Q15 and Q16 can be equal to each other; in this case, resistors are inserted into the emitters of the transistors Q15 and Q16 to adjust the collector currents flowing through the transistors Q15 and Q16.

In each of the transistors of the current mirror circuits CM1 and CM2, a collector current $I_C$ is defined by $$I_C = I_S exp(V_{BE}/kT) \qquad (8)$$

where $I_S$ is a reverse-direction saturation current;
$V_{BE}$ is a base-emitter voltage;
k is Boltzmann's constant; and T is an absolute temperature.

Thus, in the sample/hold circuit of FIGS. 2, 3A (3B) and 4A (4B), since only the transistor Q13 is connected in series to the emitter of the transistor Q1, and only the transistor Q16 is connected in series to the emitter of the transistor Q2, the input/output dynamic range of the voltage buffer BUF2, i.e., the input/output dynamic range of the sample/hold circuit of FIG. 2 can be increased as compared with that of FIG. 1.

The sampling operation of the sample/hold circuit of FIG. 2 is explained below. In this case, the control voltage V0 is made high so that V0>VR0, for example, V0=VR0+300 mV. As a result, the transistor Q10 is biased by the current source I0 so that the transistor Q10 is turned ON, while the transistor Q9 is turned OFF. Therefore, the current mirror circuit CM1 is activated, and accordingly, the current mirror circuit CM2 is activated. That is, since the input current of the current mirror circuit CM1 is I0, the first output current of the current mirror circuit CM1 is I0×m and the second output current of the current mirror circuit CM1 is I0×n. Also, since the input current of the current mirror circuit CM2 is I0×m, the output current of the current mirror circuit CM2 is I0×m×k.

Also, the base of the transistor Q3 is biased by the transistor Q1 so that the transistor Q3 is turned ON. Simultaneously, the base of the transistor Q4 is biased by the transistor Q2 so that the transistor Q4 is turned ON.

Since the transistors Q1 and Q3 are turned ON, the following formula is satisfied:

$$V_{out}=V_{in}+V_{BE}(Q1)-V_{BE}(Q3) \quad (9)$$

Similarly, since the transistors Q2 and Q4 are turned ON, the following formula is satisfied:

$$V_{out}=V_{in}-V_{BE}(Q2)+V_{BE}(Q4) \quad (10)$$

Also, in this case, $$V_{BE}(Q1) \approx V_{BE}(Q3) \quad (11)$$

$$V_{BE}(Q2) \approx V_{BE}(Q4) \quad (12)$$

From the formulae (9), (10), (11) and (12)

$$V_{out} \approx V_{in} \quad (13)$$

Thus, the hold capacitor CH is charged by the output voltage $V_{out}$ close to the input voltage $V_{in}$.

Next, the holding operation of the sample/hold circuit of FIG. 2 is explained below. In this case, the control voltage V0 is made low so that V0<VR0, for example, V0=VR0−300 mV. As a result, the transistor Q9 is biased by the current source $I_o$ so that the transistor Q9 is turned ON, while the transistor Q10 is turned OFF. Therefore, the current mirror circuit CM1 is not biased, and accordingly, the current mirror circuit CM2 is not biased. Thus, the transistors Q1 and Q2 are both turned OFF.

Also, the base of the transistor Q3 is not biased by the transistor Q1 so that the transistor Q3 is turned OFF. Simultaneously, the base of the transistor Q4 is not biased by the transistor Q2 so that the transistor Q4 is turned OFF.

Thus, the output terminal OUT is electrically isolated from the input terminal IN, so that the sampled input voltage $V_{in}$ is stored in the hold capacitor CH.

Figure 5A:
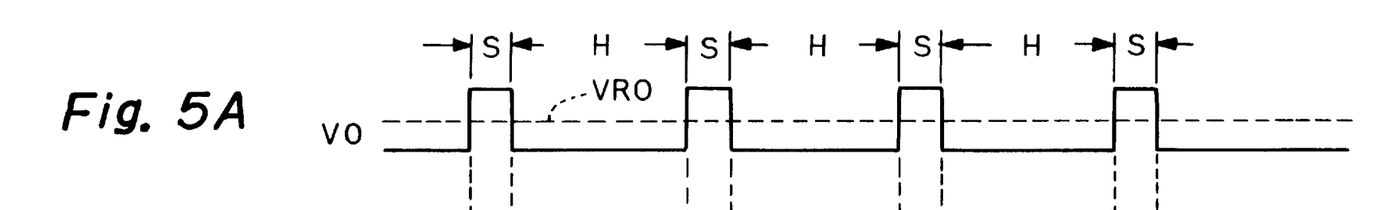
FIGS. 5A, 5B and 5C are timing diagrams showing the operation of the circuit of FIG. 2.
Figure 5B:
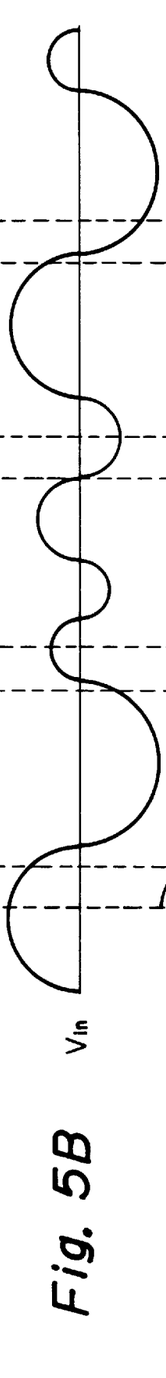
Figure 5C:
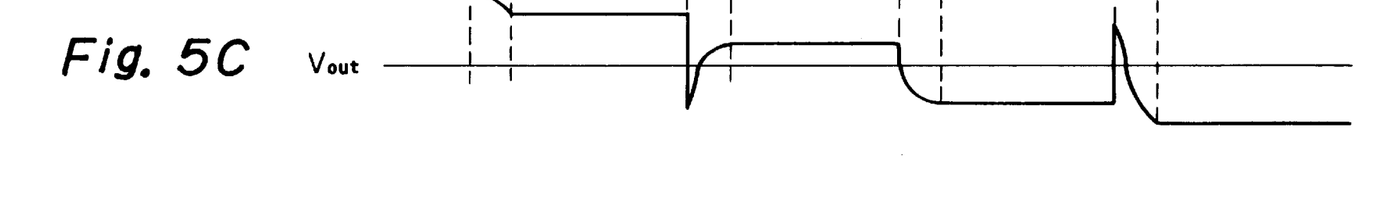

Examples of the control voltage V0, the input voltage $V_{in}$ and the output voltage $V_{out}$ are shown in FIGS. 5A, 5B and 5C. That is, in a sample time period S, the control voltage V0 is higher then VR0, so that the voltage buffer BUF2 enters a sampling state where the output voltage $V_{out}$ follows the input voltage $V_{in}$. On the other hand, in a hold time period H, since the control voltage V0 is lower than VR0, the output voltage $V_{out}$ remains at the same level immediately before entering the hold time period H.

In the above-described first embodiment, the values m, n and k are determined to compensate for the difference in operating speed between the PNP type transistor Q1 and the NPN type transistor Q2, thus exhibiting a maximum performance.

Figure 6:
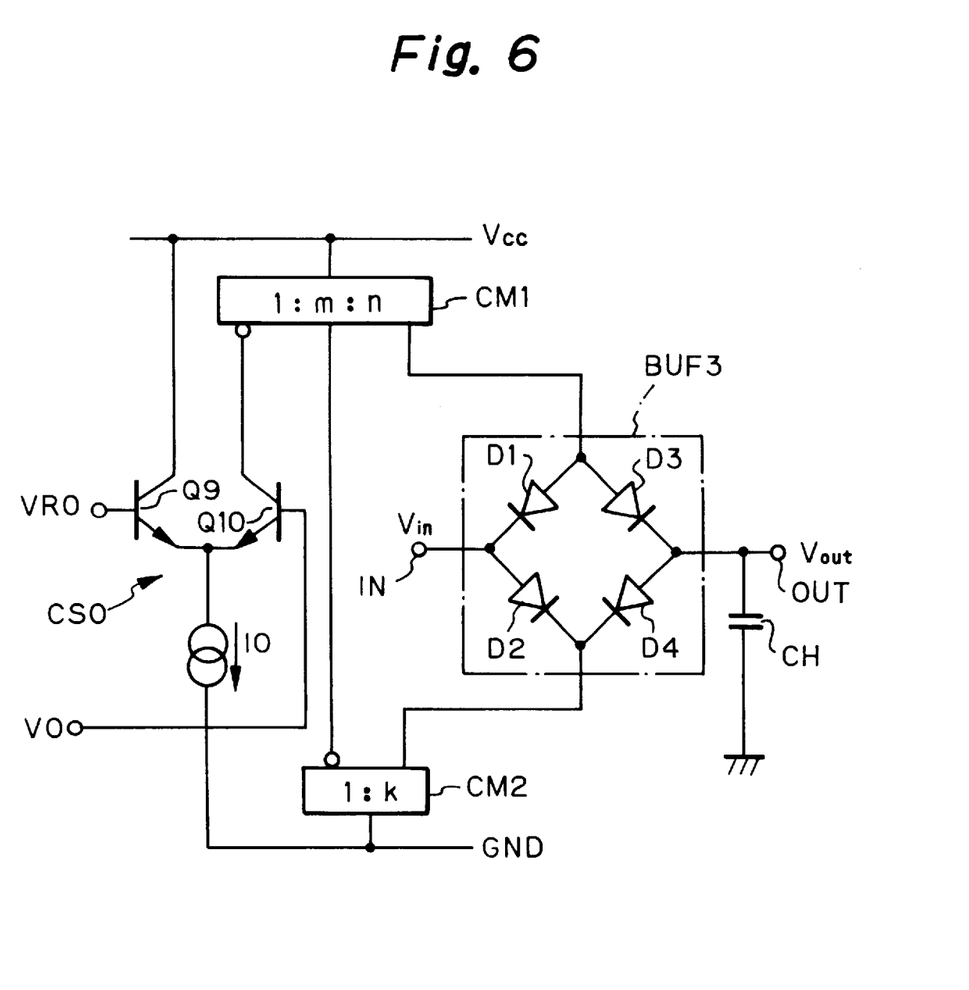
FIG. 6 is a circuit diagram illustrating a second embodiment of the sample/hold circuit according to the present invention.

In FIG. 6, which illustrates a second embodiment of the present invention, a voltage buffer BUF3 formed by a diode bridge circuit including diodes D1, D2, D3 and D4 is provided instead of the voltage buffer BUF2 of FIG. 2. That is, the anodes of the diodes D1 and D3 are connected to the current mirror circuit CM1, and the cathodes of the diodes D2 and D4 are connected to the current mirror circuit CM2. Also, the cathode of the diode D1 and the anode of the diode D2 are connected to the input terminal IN, and the cathode of the diode D3 and the anode of the diode 4 are connected to the output terminal OUT.

The sampling operation of the sample/hold circuit of FIG. 6 is explained below. In this case, the control voltage V0 is made high so that V0>VR0, for example, V0=VR0+300 mV. As a result, the transistor Q10 is biased by the current source I0 so that the transistor Q10 is turned ON, while the transistor Q9 is turned OFF. Therefore, the current mirror circuit CM1 is activated, and accordingly, the current mirror circuit CM2 is activated. That is, since the input current of the current mirror circuit CM1 is I0, the first output current of the current mirror circuit, CM1 is I0×m and the second output current of the current mirror circuit CM1 is I0×n. Also, since the input current of the current mirror circuit CM2 is I0×m, the output current of the current mirror circuit CM2 is I0×m×k. In this case, the following condition is satisfied:

$$I0 \times n = I_o \times m \times k \therefore n = m \times k \quad (14)$$

Also, the forward voltage $V_{D1}$ of the diode D1 is adjusted to be the same as the forward voltage $V_{D3}$ of the diode D3, and the forward voltage $V_{D2}$ of the diode D2 is adjusted to be the same as the forward voltage $V_{D4}$ of the diode D4. That is, $$V_{D1}=V_{D3} \quad (15)$$

$$V_{D2}=V_{D4} \quad (16)$$

Since the diodes D1 and D3 are operated, the following formula is satisfied:

$$V_{out}=V_{in}+V_{D1}-V_{D3} \quad (17)$$

Similarly, since the diodes D2 and D4 are operated, the following formula is satisfied:

$$V_{out}=V_{in}-V_{D2}+V_{D4} \quad (18)$$

From the formulae (15), (16), (17) and (18)

$$V_{out}=V_{in} \quad (19)$$

Thus, the hold capacitor CH is charged by the output voltage $V_{out}$ equal to the input voltage $V_{in}$. Next, the holding operation of the sample/hold circuit of FIG. 6 is explained below. In this case, the control voltage V0 is made low so that V0<VR0, for example, V0=VR0−300 mV. As a result, the transistor Q9 is biased by the current source $I_o$ so that the transistor Q9 is turned ON, while the transistor Q10 is turned OFF. Therefore, the current mirror circuit CM1 is not biased, and accordingly, the current mirror circuit CM2 is not biased. Thus, the diodes D1, D2, D3 and D4 are all turned OFF.

Thus, the output terminal OUT is electrically isolated from the input terminal IN, so that the sampled input voltage $V_{in}$ is stored in the hold capacitor CH.

Figure 7:
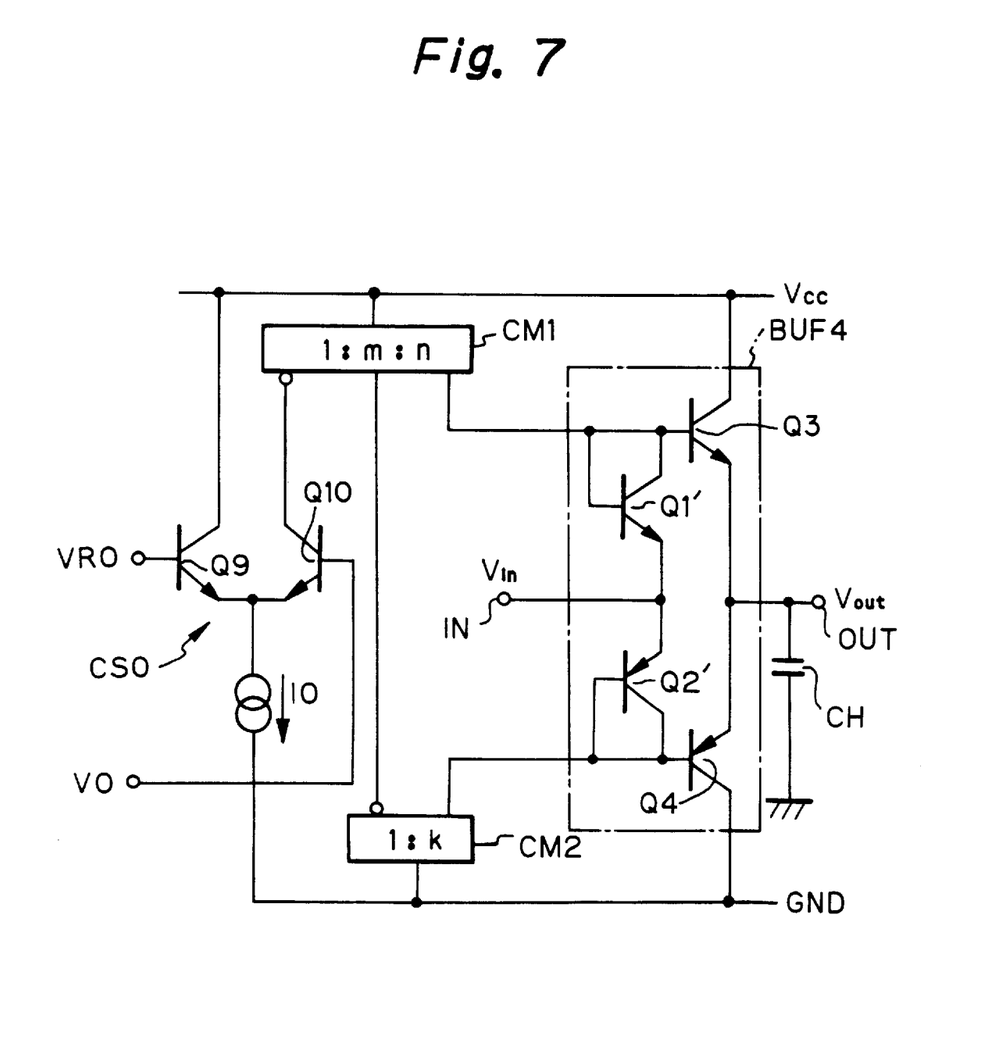
FIG. 7 is a circuit diagram illustrating a third embodiment of the sample/hold circuit according to the present invention.

In FIG. 7, which illustrates a third embodiment of the present invention, a voltage buffer BUF4 is provided instead of the voltage buffer BUF2 of FIG. 2. In more detail, in the voltage buffer BUF4, an NPN type transistor Q1' is provided instead of the PNP type transistor Q1 of FIG. 2, and a PNP type transistor Q2' is provided instead of the NPN type transistor Q2 of FIG. 2.

The collector and base of the transistor Q1' are connected to the current mirror circuit CM1, and the emitter of the transistor Q1' is connected to the input terminal IN. On the other hand, the collector and base of the transistor Q2' are connected to the current mirror circuit CM2, and the emitter of the transistor Q2' is connected to the input terminal IN.

Also, if n=m×k, a flow-in current is hardly supplied to the input terminal INT and a flow-out current is hardly supplied from the input terminal IN, so that a driving current ability for the input terminal IN can be reduced. Also, at a completion of a sampling operation, the collector current of the NPN type transistor Q1' can be equal to that of the NPN type transistor Q3, and the collector current of the NPN type transistor Q2' can be equal to that of the NPN type transistor Q4.

The sampling operation of the sample/hold circuit of FIG. 7 is explained below. In this case, the control voltage V0 is made high so that V0>VR0, for example, V0=VR0+300 mV. As a result, the transistor Q10 is biased by the current source I0 so that the transistor Q10 is turned ON, while the transistor Q9 is turned OFF. Therefore, the current mirror circuit CM1 is activated, and accordingly, the current mirror circuit CM2 is activated. That is, since the input current of the current mirror circuit CM1 is I0, the first output current of the current mirror circuit CM1 is I0×m and the second output current of the current mirror circuit CM1 is I0×n. Also, since the input current of the current mirror circuit CM2 is I0×m, the output current of the current mirror circuit CM2 is I0×m×k.

Also, the base of the transistor Q3 is biased by the transistor Q1' so that the transistor Q3 is turned ON. Simultaneously, the base of the transistor Q4 is biased by the transistor Q2' so that the transistor Q4 is turned ON.

Since the transistors Q1' and Q3 are turned ON, the following formula is satisfied:

$$V_{out}=V_{in}+V_{BE}(Q1')-V_{BE}(Q3) \quad (20)$$

where $V_{BE}(Q1')$ is a base-emitter voltage of the transistor Q1'.

Similarly, since the transistors Q2' and Q4 are turned ON, the following formula is satisfied:

$$V_{out}=V_{in}-V_{BE}(Q2')+V_{BE}(Q4) \quad (21)$$

where $V_{BE}(Q2')$ is a base-emitter voltage of the transistor Q2'.

Also, $$V_{BE}(Q1')=V_{BE}(Q3) \quad (22)$$

$$V_{BE}(Q2')=V_{BE}(Q4) \quad (23)$$

From the formulae (20), (21), (22) and (23)

$$V_{out}=V_{in} \quad (24)$$

Thus, the hold capacitor CH is charged by the output voltage $V_{out}$ equal to the input voltage $V_{in}$.

Next, the holding operation of the sample/hold circuit of FIG. 7 is explained below. In this case, the control voltage V0 is made low so that V0<VR0, for example, V0=VR0−300 mV. As a result, the transistor Q9 is biased by the current source $I_o$ so that the transistor Q9 is turned ON, while the transistor Q10 is turned OFF. Therefore, the current mirror circuit CM1 is not biased, and accordingly, the current mirror circuit CM2 is not biased. Thus, the transistors Q1' and Q2' are both turned Also, the base of the transistor Q3 is not biased by the transistor Q1' so that the transistor Q3 is turned OFF. Simultaneously, the base of the transistor Q4 is not biased by the transistor Q2' so that the transistor Q4 is turned OFF.

Thus, the output terminal OUT is electrically isolated from the input terminal IN, so that the sampled input voltage $V_{in}$ is stored in the hold capacitor CH.

In the sample-hold circuit of FIG. 2, since there is an offset in the base-emitter voltage between the PNP transistor Q1 (Q4) and the NPN transistor Q3 (Q2) due to the manufacturing processes thereof, the output voltage $V_{out}$ hardly becomes equal to the input voltage $V_{in}$ (see the formula (13)). Contrary to this, in the sample-hold circuit of FIG. 7, since there is no substantial offset in the base-emitter voltage between the same type transistors Q1' (Q4) and Q3 (Q2') due to the manufacturing processes thereof, the output voltage $V_{out}$ becomes completely equal to the input voltage $V_{in}$ (see the formula (24)).

As explained hereinabove, according to the present invention, since the number of current switches is reduced, the circuit configuration can be simplified, and the power dissipation can be reduced. In addition, since the voltage buffer is turned ON and OFF by the current mirror circuits, the output voltage is not affected by current switches, so that the input/output dynamic range can be increased.

I claim:

1. A sample/hold circuit comprising:
   a current switch for generating a constant current in response to a control signal;
   a first current mirror circuit, connected to said current switch, for receiving said constant current to generate first and second currents;
   a second current mirror circuit, connected to said first current mirror circuit, for receiving said first current to generate a third current;
   a voltage buffer, connected to said first and second current mirror circuits, for receiving an input voltage at an input terminal to generate an output voltage at an output terminal, said voltage buffer being activated by said second and third currents; and
   a hold capacitor connected to said output terminal.

2. The sample/hold circuit as set forth in claim 1, wherein a ratio of said constant current, said first current and said second current is 1:m:n, wherein m is a first current multiplier constant and n is a second current multiplier constant, and a ratio of said first current and said third current is 1:k, wherein k is a third current multiplier constant.

3. The sample/hold circuit as set forth in claim 1, wherein said voltage buffer comprises:
   a first transistor of a first type having an emitter for receiving said second current from said first current mirror circuit, a collector connected to a first power supply terminal, and a base connected to said input terminal;
   a second transistor of a second type having an emitter for receiving said third current from said second current mirror circuit, a collector connected to a second power supply terminal, and a base connected to said input terminal;

a third transistor of said second type having a base for receiving said second current from said first current mirror circuit, a collector connected to said second power supply terminal, and an emitter connected to said output terminal; and a fourth transistor of said first type having a base for receiving said third current from said second current mirror circuit, a collector connected to said first power supply terminal, and an emitter connected to said output terminal.

4. The sample/hold circuit as set forth in claim 1, wherein said voltage buffer comprises a diode bridge circuit powered by said second current and said third current and connected between said input terminal and said output terminal.

5. The sample/hold circuit as set forth in claim 4, wherein said diode bridge circuit comprises:

first and second diodes having anodes for receiving said second current; and third and fourth diodes having cathodes for receiving said third current, a cathode of said first diode and an anode of said third diode being connected to said input terminal, a cathode of said second diode and an anode of said fourth diode being connected to said output terminal.

6. The sample/hold circuit as set forth in claim 5, wherein a ratio of said second current and said third current is 1.

7. The sample/hold circuit as set forth in claim 1, wherein said voltage buffer comprises:

a first transistor of a first type having a collector and a base for receiving said second current from said first current mirror circuit, and an emitter connected to said input terminal;

a second transistor of a second type having a collector and a base for receiving said third current from said second current mirror circuit, and an emitter connected to said input terminal;

a third transistor of said first type having a base for receiving said second current from said first current mirror circuit, a collector connected to said second power supply terminal, and an emitter connected to said output terminal; and a fourth transistor of said second type having a base for receiving said third current from said second current mirror circuit, a collector connected to said first power supply terminal, and an emitter connected to said output terminal.

8. The sample/hold circuit as set forth in claim 7, wherein a ratio of said second current and said third current is 1.

9. A sample/hold circuit comprising:

a ground terminal;

a power supply terminal;

an input terminal for receiving an input voltage;

an output terminal for generating an output voltage;

a first NPN type transistor having a collector connected to said power supply terminal, a base for receiving a reference voltage and an emitter;

a second NPN type transistor having a collector, a base for receiving a sample/hold control signal and an emitter;

a constant current source connected between the emitters of said first and second NPN type transistors and said ground terminal;

a first current mirror circuit, connected between said power supply terminal and the collector of said second NPN type transistor, for generating first and second currents when said second NPN type transistor is turned ON;

a second current mirror circuit, connected between said first current mirror circuit and said ground terminal, for receiving said first current from said first current mirror circuit to generate a third current;

a first PNP type transistor having an emitter for receiving said second current from said first current mirror circuit, a collector connected to said ground terminal, and a base connected to said input terminal;

a third NPN type transistor having an emitter for receiving said third current from said second current mirror circuit, a collector connected to said power supply terminal, and a base connected to said input terminal;

a fourth NPN type transistor having a base for receiving said second current from said first current mirror circuit, a collector connected to said power supply terminal, and an emitter connected to said output terminal;

a second PNP type transistor having a base for receiving said third current from said second current mirror circuit, a collector connected to said ground terminal, and an emitter connected to said output terminal; and a hold capacitor connected to said output terminal.

10. A sample/hold circuit comprising:

a ground terminal;

a power supply terminal;

an input terminal for receiving an input voltage;

an output terminal for generating an output voltage;

a first NPN type transistor having a collector connected to said power supply terminal, a base for receiving a reference voltage and an emitter;

a second NPN type transistor having a collector, a base for receiving a sample/hold control signal and an emitter;

a constant current source connected between the emitters of said first and second NPN type transistors and said ground terminal;

a first current mirror circuit, connected between said power supply terminal and the collector of said second NPN type transistor, for generating first and second currents when said second NPN type transistor is turned ON;

a second current mirror circuit, connected between said first current mirror circuit and said ground terminal, for receiving said first current from said first current mirror circuit to generate a third current, said third current being equal to said second current;

first and second diodes having anodes for receiving said second current;

third and fourth diodes having cathodes for receiving said third current; and a hold capacitor connected to said output terminal, a cathode of said first diode and an anode of said third diode being connected to said input terminal, a cathode of said second diode and an anode of said fourth diode being connected to said output terminal.

11. A sample/hold circuit comprising:

a ground terminal;

a power supply terminal;

an input terminal for receiving an input voltage;

an output terminal for generating an output voltage;

a first NPN type transistor having a collector connected to said power supply terminal, a base for receiving a reference voltage and an emitter;

a second NPN type transistor having a collector, a base for receiving a sample/hold control signal and an emitter;

a constant current source connected between the emitters of said first and second NPN type transistors and said ground terminal;

a first current mirror circuit, connected between said power supply terminal and the collector of said second NPN type transistor, for generating first and second currents when said second NPN type transistor is turned ON;

a second current mirror circuit, connected between said first current mirror circuit and said ground terminal, for receiving said first current from said first current mirror circuit to generate a third current, said third current being equal to said second current;

a third NPN type transistor having a collector and a base for receiving said second current from said first current mirror circuit, and an emitter connected to said input terminal;

a first PNP type transistor having a collector and a base for receiving said third current from said second current mirror circuit, and an emitter connected to said input terminal;

a fourth NPN type transistor having a base for receiving said second current from said first current mirror circuit, a collector connected to said power supply terminal, and an emitter connected to said output terminal;

a second PNP type transistor having a base for receiving said third current from said second current mirror circuit, a collector connected to said ground terminal, and an emitter connected to said output terminal; and a hold capacitor connected to said output terminal.

* * * * *